United States Patent
Park et al.

(10) Patent No.: US 12,494,373 B2
(45) Date of Patent: Dec. 9, 2025

(54) PLASMA ETCHING APPARATUS COMPONENT FOR MANUFACTURING SEMICONDUCTOR COMPRISING COMPOSITE SINTERED BODY AND MANUFACTURING METHOD THEREFOR

(71) Applicant: KOREA INSTITUTE OF MATERIALS SCIENCE, Changwon-si (KR)

(72) Inventors: Young Jo Park, Changwon-si (KR); Ha Neul Kim, Changwon-si (KR); Jae Woong Ko, Changwon-si (KR); Mi Ju Kim, Gimhae-si (KR); Hyeon Myeong Oh, Changwon-si (KR)

(73) Assignee: KOREA INSTITUTE OF MATERIALS SCIENCE, Changwon-si (KR)

( * ) Notice: Subject to any disclaimer, the term of this patent is extended or adjusted under 35 U.S.C. 154(b) by 280 days.

(21) Appl. No.: 18/244,863

(22) Filed: Sep. 11, 2023

(65) Prior Publication Data
US 2024/0055266 A1  Feb. 15, 2024

Related U.S. Application Data

(63) Continuation of application No. 17/628,515, filed as application No. PCT/KR2020/009193 on Jul. 13, 2020, now abandoned.

(30) Foreign Application Priority Data

Jul. 22, 2019 (KR) .................. 10-2019-0088164
May 25, 2020 (KR) .................. 10-2020-0062190

(51) Int. Cl.
*H01L 21/3065* (2006.01)
*B22F 3/10* (2006.01)
*H01J 37/32* (2006.01)

(52) U.S. Cl.
CPC ............ *H01L 21/3065* (2013.01); *B22F 3/10* (2013.01); *H01J 37/32009* (2013.01); *H01J 2237/334* (2013.01)

(58) Field of Classification Search
None
See application file for complete search history.

(56) References Cited

U.S. PATENT DOCUMENTS

2003/0049499 A1 * 3/2003 Murakawa .............. C04B 35/44
428/697

FOREIGN PATENT DOCUMENTS

| CN | 103539433 A | 1/2014 |
|---|---|---|
| JP | 5-330903 A | 12/1993 |

(Continued)

OTHER PUBLICATIONS

Korean Office Action ("Request for the Submission of Opinion" dated Sep. 17, 2021 for related Korean Patent Application No. 10-2020-0062190.

(Continued)

*Primary Examiner* — Roberts P Culbert
(74) *Attorney, Agent, or Firm* — Sughrue Mion, PLLC

(57) ABSTRACT

Provided is a method of using a plasma etching apparatus in semiconductor manufacturing, the method including using a plasma etching apparatus in semiconductor manufacturing, the plasma etching apparatus comprising a component including a composite sintered body therein, wherein the composite sintered body comprises 30 vol % to 70 vol % of yttria (Y2O3) and 30 vol % to 70 vol % of magnesia (MgO), and wherein the component has plasma resistance. In addition, provided is a method of reducing etching by plasma in a plasma etching apparatus during semiconductor manufacturing, the method including providing a plasma etching apparatus for manufacturing a semiconductor including a (Continued)

component including a composite sintered body, wherein the composite sintered body comprises 30 vol % to 70 vol % of yttria ($Y_2O_3$) and 30 vol % to 70 vol % of magnesia (MgO), and wherein the component has plasma resistance.

13 Claims, 10 Drawing Sheets

(56) References Cited

FOREIGN PATENT DOCUMENTS

| | | |
|---|---|---|
| JP | 2003-238250 A | 8/2003 |
| JP | 2006-8493 A | 1/2006 |
| KR | 10-2003-0040115 A | 5/2003 |
| KR | 10-2008-0096340 A | 10/2008 |
| KR | 10-2017-0127636 A | 11/2017 |

OTHER PUBLICATIONS

Written Decision on Registration dated Apr. 1, 2022 for related Korean Patent Application No. 10-2020-0062190.

Alhaji et al, "Study of crystallization behavior and kinetics of yttria-50 vol. % magnesia composite nanopowders using a non-isothermal process," J. Sol-Gel Sci. Technol. (2018) 85, pp. 93-102 (published online, Oct. 23, 2017) (Year: 2017).

Search Report dated Oct. 27, 2020, corresponding to International Application No. PCT/KR2020/009193 (filed Jul. 13, 2020), a related application, 6 pp.

\* cited by examiner

EXAMPLE 2

200nm

COMPARATIVE EXAMPLE 2

300 μm

PLASMA ETCHING APPARATUS COMPONENT FOR MANUFACTURING SEMICONDUCTOR COMPRISING COMPOSITE SINTERED BODY AND MANUFACTURING METHOD THEREFOR

CROSS-REFERENCE TO RELATED APPLICATIONS

This application is a Rule 53(b) Continuation of U.S. application Ser. No. 17/628,515, filed Jan. 19, 2022, which is a U.S. National Stage Application filed under 35 U.S.C. § 371 of International Application No. PCT/KR2020/009193, filed Jul. 13, 2020, which claims the benefit of Korean Application Nos. KR 10-2019-0088164, filed Jul. 22, 2019 and KR 10-2020-0062190, filed May 25, 2020, the respective disclosures of all of the above of which are hereby incorporated by reference in their entireties.

TECHNICAL FIELD

The present disclosure relates to a plasma etching apparatus component for manufacturing a semiconductor including a composite sintered body and a manufacturing method therefor.

BACKGROUND ART

Electronic components such as semiconductor devices and liquid crystal displays are made by repeating processes such as lamination, patterning, etching, and cleaning of various metals and non-metal materials. Among the processes, the etching process is a process of forming an etching target material in a desired shape, which is one of the most frequently performed processes. The etching process is performed by various equipment and methods, and may be broadly divided into isotropic etching and anisotropic etching. The isotropic etching is a method in which etching is performed along a specific direction, and usually includes chemical etching such as wet etching or barrel plasma etching.

The anisotropic etching may include most dry etching such as reactive ion etching. In the reactive ion etching, a reaction gas is ionized and electrically accelerated in a process chamber and, so that the etching is performed mainly along an electric field direction. Mostly, in the dry etching, plasma is formed to activate a reaction gas, and in order to form the plasma, a method of applying a high frequency (RF) electric field to the reaction gas is mainly used. However, in recent years, as electronic components have become increasingly fine, RF power has continued to increase, so that the corrosion resistance of process equipment components to plasma has become important. For example, RF power of about 1,000 W was used in general in the past, but in recent years, power of about 2,500 W has been also required.

Here, a number of core components (ceramic components) are inside a plasma etching apparatus, and these components should have corrosion resistance, chemical resistance, and mechanical physical properties against plasma atmosphere formed at a temperature of 150° C. to 200° C.

Typically, alumina ($Al_2O_3$) has been mainly used as a member used in the plasma etching apparatus for manufacturing a semiconductor, but alumina ($Al_2O_3$) has weak corrosion resistance to plasma, and thus, is not suitable as a member in an environment in which RF power increases. In order to overcome the limitations, an yttria ($Y_2O_3$) layer has been applied on alumina and employed, but yttria has a bending strength of about 160 MPa, which is significantly less than the bending strength of alumina, which is about 430 MPa, and thus, has low thermal stability is prone to damage such as cracking. Here, a component of the plasma etching apparatus component for manufacturing a semiconductor includes nozzles, injectors, rings, or the like.

For example, Korean Patent Registration No. 10-0851833 discloses a quartz glass component including quartz glass and a ceramic thermal sprayed film formed on the surface of the quartz glass, wherein the ceramic thermal sprayed film has a surface roughness Ra of 5 to 20 μm and a relative density of 70% to 97%.

In addition, Korean Patent Registration No. 10-0917292 discloses a ceramic product resistant to corrosion by halogen-containing-plasma used in semiconductor processing, and the ceramic product includes a ceramic having at least two phases, and is formed of yttrium oxide in a molar concentration range of about 50 mole % to about 75 mole %, zirconium oxide in a molar concentration range of about 10 mole % to about 30 mole %, and at least one other component selected from the group consisting of aluminum oxide, hafnium oxide, scandium oxide, neodymium oxide, niobium oxide, samarium oxide, ytterbium oxide, erbium oxide, cerium oxide, and a combination thereof, wherein the concentration range of the at least one other component is about 10 mole % to about 30 mole %.

However, as described above, there is a problem in that such typical techniques have weak corrosion resistance to plasma, have low thermal stability, and are prone to damage such as cracking.

Therefore, since the above number of components (ceramic parts) are consumable and should be replaced due to other factors such as corrosion after being used for a certain period of time, parts with improved mechanical physical properties and improved plasma resistance are in demand. In addition, in recent years, in the midst of keen competition for line width miniaturization of semiconductors, the reduction of contaminant particles is strongly required to improve production yields. That is, it is important to develop a material which satisfies the necessary condition of lowering an etching rate, the condition which is typically pursued, as well as the sufficient condition of controlling a microstructure or composition to reduce the generation of contaminant particles.

PRIOR ART DOCUMENT

Korean Patent Registration No. 10-0851833
Korean Patent Registration No. 10-0917292

DISCLOSURE OF THE INVENTION

Technical Problem

One object of the present invention is to provide a plasma etching apparatus component for manufacturing a semiconductor, the component including a composite sintered body containing yttria and magnesia and having excellent corrosion resistance to plasma.

Technical Solution

In order to achieve the objects, the present invention provides a plasma etching apparatus component for manufacturing a semiconductor characterized by including a composite sintered body which contains 30 vol % to 70 vol % of yttria ($Y_2O_3$) and 30 vol % to 70 vol % of magnesia (MgO) and having plasma resistance.

The present invention also provides a method for manufacturing a plasma etching apparatus component for manufacturing a semiconductor, the method including mixing 30 vol % to 70 vol % of yttria ($Y_2O_3$) and 30 vol % to 70 vol % of magnesia (MgO), and sintering the mixed yttria ($Y_2O_3$) and magnesia (MgO).

Furthermore, the present invention provides a plasma etching apparatus for manufacturing a semiconductor including the plasma etching apparatus component.

A plasma etching apparatus component for manufacturing a semiconductor has excellent corrosion resistance to plasma, and may have good corrosion resistance to plasma even when a composite sintered body is sintered at a relatively low relative density.

Advantageous Effects

In addition, a composite sintered body included in the plasma etching apparatus component for manufacturing a semiconductor has a small crystal grain size and a small increase in surface roughness after etching, so that there is an effect that contaminant particles may be reduced.

Furthermore, the plasma etching apparatus component for manufacturing a semiconductor has excellent strength compared to a typical plasma-resistant material, is inexpensive, and is excellent in terms of economic feasibility and utilization.

BEST MODE FOR CARRYING OUT THE INVENTION

Figure 1:
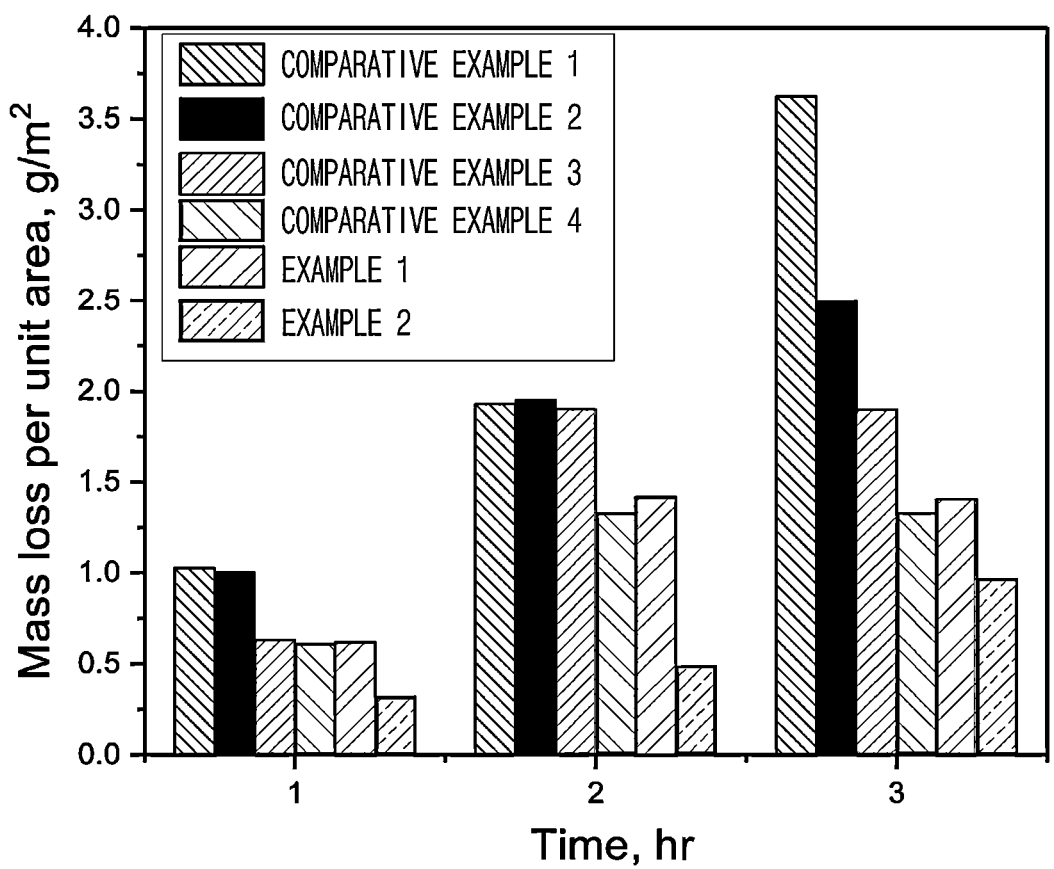
FIG. 1 is a graph showing the measurement of weight reduction by etching using plasma according to one experimental example of the present invention.

Unless otherwise defined, all technical and scientific terms used herein have the same meaning as commonly understood by those skilled in the art to which the present invention pertains.

In one aspect of the present invention, there is provided a plasma etching apparatus component for manufacturing a semiconductor characterized by including a composite sintered body which contains 30 vol % to 70 vol % of yttria ($Y_2O_3$) and 30 vol % to 70 vol % of magnesia (MgO) and has plasma resistance.

Hereinafter, the plasma etching apparatus component for manufacturing a semiconductor provided in one aspect of the present invention will be described in detail.

First, the plasma etching apparatus component provided in one aspect of the present invention includes a composite sintered body containing yttria ($Y_2O_3$) and magnesia (MgO).

The yttria and magnesia may be mixed in a powder form.

It is preferable that the yttria has a purity of 99% or higher.

In addition, the particle size of the yttria may be 10 nm to 1000 nm. Preferably, the particle size of the yttria may be 20 nm to 500 nm, more preferably 30 nm to 300 nm. When the particle size of the yttria is less than 10 nm, there is a problem in that mixing and molding are difficult, and when greater than 1000 nm, there is a problem in that strength and sinterability are degraded.

It is preferable that the magnesia has a purity of 99% or higher.

In addition, the particle size of the magnesia may be 10 nm to 1000 nm. Preferably, the particle size of the magnesia may be 20 nm to 500 nm, more preferably 30 nm to 300 nm. When the particle size of the magnesia is less than 10 nm, there is a problem in that mixing and molding are difficult, and when greater than 1000 nm, there is a problem in that strength and sinterability are degraded.

The composite sintered body may include 20 vol % to 80 vol % of yttria and 20 vol % to 80 vol % of magnesia. The composite sintered body may include 30 vol % to 70 vol % of yttria and 30 vol % to 70 vol % of magnesia, 40 vol % to 60 vol % of yttria and 40 vol % to 60 vol % of magnesia, 25 vol % to 45 vol % of yttria and 55 vol % to 75 vol % of magnesia, 55 vol % to 75 vol % of yttria and 25 vol % to 45 vol % of magnesia, 20 vol % to 35 vol % of yttria and 65 vol % to 80 vol % of magnesia, or 65 vol % to 80 vol % of yttria and 20 vol % to 35 vol % of magnesia.

When the composite sintered body contains less than 20 vol % of yttria, there are problems in that sintering may be difficult, particles may be easily formed by plasma irradiation, and strength may become relatively weak. When the composite sintered body contains less than 20 vol % of magnesia, there is a problem in that plasma resistance may be low.

The yttria and the magnesia may be mixed by milling, but the mixing method thereof is not limited thereto. The mixing may be performed by any method commonly used in the art.

The composite sintered body may have a relative density of 90% or higher, preferably 92% or higher, more preferably 95% or higher, and even more preferably 98% or higher.

Even when the composite sintered body has a relative density of less than 100%, the composite sintered body has good plasma resistance.

The composite sintered body may have a surface roughness ($R_a$) of 2 nm or less.

When the composite sintered body is exposed to $CF_4/O_2$ plasma of 500 W output and 100 W bias for 3 hours, the surface roughness ($R_a$) of the composite sintered body may increase by 5 times or less, preferably 4 times or less, more preferably 3.5 times or less, even more preferably 3 times or less, and most preferably 1.5 times or less.

Even when exposed to plasma, the composite sintered body has a small increase in surface roughness compared to typical plasma-resistant materials, and even after the exposure to plasma, the composite sintered body has a relatively low surface roughness, so that contamination particles may be reduced since generated particles generated by etching may be easily discharged out of a chamber.

When the composite sintered body is exposed to $CF_4/O_2$ plasma of 500 W output and 100 W bias for 3 hours, the etching depth of the composite sintered body may be 200 nm or less, preferably 180 nm or less, and more preferably 150 nm or less.

The composite sintered body may have a crystal grain size of 100 nm to 1 μm, preferably 100 nm to 500 nm, and most preferably 150 nm to 350 nm.

Here, the crystal grain size of a composite sintered body means an average particle diameter of crystal grains.

The crystal grain size of the composite sintered body is very small compared to that of typical plasma resistance materials, and as a result, contaminant particles may be reduced since the size of generated particles generated by etching after the exposure to plasma becomes relatively small, allowing the generated particles to easily discharged out of a chamber.

The composite sintered body may further include a sintering additive. The sintering additive may be, for example, $ZrO_2$, $ThO_2$, or $La_2O_3$, but is not limited thereto, and may be a common additive commonly used in the art.

The composite sintered body may include a sintering additive in 8 mol % or less, preferably 0.1 mol % to 4 mol %, and more preferably 0.5 mol % to 3 mol %.

The composite sintered body may have a biaxial strength of 100 MPa, preferably a biaxial strength of 200 MPa or greater, more preferably a biaxial strength of 300 MPa or greater, and most preferably a biaxial strength of 350 MPa or greater.

The plasma etching apparatus component for manufacturing a semiconductor may be formed of a bulk material of the composite sintered body.

In addition, the plasma etching apparatus component for manufacturing a semiconductor may be formed by coating the composite sintered body on another material. The another material may be, for example, a metal, a ceramic, a polymer, and the like, but is not limited to a specific material.

The plasma etching apparatus component for manufacturing a semiconductor provided in one aspect of the present invention may be nozzles, injectors, or rings, but is not limited thereto, and may be any component required to have plasma resistance in a plasma etching apparatus for manufacturing a semiconductor.

In another aspect of the present invention, there is provided a method for manufacturing a plasma etching apparatus component for manufacturing a semiconductor, the method including mixing 30 vol % to 70 vol % of yttria ($Y_2O_3$) and 30 vol % to 70 vol % of magnesia (MgO), and sintering the mixed yttria ($Y_2O_3$) and magnesia (MgO).

Hereinafter, each step of the method for manufacturing a plasma etching apparatus component for manufacturing a semiconductor provided in another aspect of the present invention will be described in detail.

First, the method for manufacturing a plasma etching apparatus component for manufacturing a semiconductor provided in another aspect of the present invention includes a step of mixing yttria ($Y_2O_3$) and magnesia (MgO).

The yttria and magnesia may be mixed in a powder form.

It is preferable that the yttria powder has a purity of 99% or higher.

In addition, the particle size of the yttria may be 10 nm to 1000 nm. Preferably, the particle size of the yttria may be 20 nm to 500 nm, more preferably 30 nm to 300 nm. When the particle size of the yttria is less than 10 nm, there is a problem in that mixing and molding are difficult, and when greater than 1000 nm, there is a problem in that strength and sinterability are degraded.

It is preferable that the magnesia has a purity of 99% or higher.

In addition, the particle size of the magnesia may be 10 nm to 1000 nm. Preferably, the particle size of the magnesia may be 20 nm to 500 nm, more preferably 30 nm to 300 nm. When the particle size of the magnesia is less than 10 nm, there is a problem in that mixing and molding are difficult, and when greater than 1000 nm, there is a problem in that strength and sinterability are degraded.

The above step may further include a step of calcining the yttria and the magnesia. Nanoparticles in a uniform form without agglomeration may be obtained through the calcination step. After the calcination step, the particle size of the nanoparticles may be increased by local sintering among the nanoparticles.

The calcination step may be performed at a temperature of 1000° C. to 1500° C.

In the mixing step, 20 vol % to 80 vol % of yttria and 20 vol % to 80 vol % of magnesia may be mixed. 30 vol % to 70 vol % of yttria and 30 vol % to 70 vol % of magnesia, 40 vol % to 60 vol % of yttria and 40 vol % to 60 vol % of magnesia, 25 vol % to 45 vol % of yttria and 55 vol % to 75 vol % of magnesia, 55 vol % to 75 vol % of yttria and 25 vol % to 45 vol % of magnesia, 20 vol % to 35 vol % of yttria and 65 vol % to 80 vol % of magnesia, or 65 vol % to 80 vol % of yttria and 20 vol % to 35 vol % of magnesia may be mixed.

In the mixing step, when less than 20 vol % of yttria is mixed, there are problems in that sintering may be difficult, particles may be easily formed by plasma irradiation, and strength may become relatively weak. When less than 20 vol % of magnesia is contained, there is a problem in that plasma resistance may be low.

The mixing step may be performed by mixing yttria and the magnesia by milling, but the mixing method thereof is not limited thereto. The mixing may be performed by any method commonly used in the art.

Next, the method for manufacturing a plasma etching apparatus component for manufacturing a semiconductor provided in another aspect of the present invention includes a step of sintering yttria ($Y_2O_3$) and magnesia (MgO).

The sintering may be performed by hot pressing (HP) or hot isostatic pressing (HIP), but is not limited thereto.

The above step may be performed at a temperature of 1000° C. to 1500° C. and a pressure of 10 MPa to 70 MPa. Specifically, the above step may be performed at a temperature of 1100° C. to 1400° C.

When sintering is performed at a temperature lower than 1100° C., there is a problem in that sintering is not sufficiently achieved. When sintering is performed at a temperature higher than 1500° C., there is a problem in that excessive energy is unnecessarily consumed, particles grow excessively, and strength may be degraded.

In the above step, sintering may be performed by further including a sintering additive. The sintering additive may be, for example, $ZrO_2$, $ThO_2$, or $La_2O_3$, but is not limited thereto, and may be a common additive commonly used in the art.

In the above step, a sintering additive may be included in 8 mol % or less, preferably 0.1 mol % to 4 mol %, and more preferably 0.5 mol % to 3 mol %.

The sintered composite sintered body may have a relative density of 90% or higher, preferably 92% or higher, more preferably 95% or higher, and even more preferably 98% or higher.

Even when the sintered composite sintered body has a relative density of less than 100%, the sintered composite sintered body has improved plasma resistance compared to a typical plasma-resistant ceramic.

That is, as described above, even when a composite sintered body having a relatively low relative density is obtained by performing sintering at a relatively low temperature, it is possible to obtain a composite sintered body having sufficiently excellent plasma resistance, so that a process advantage may be obtained.

The composite sintered body may have a surface roughness ($R_a$) of 2 nm or less.

When the composite sintered body is exposed to $CF_4/O_2$ plasma of 500 W output and 100 W bias for 3 hours, the surface roughness ($R_a$) of the composite sintered body may increase by 5 times or less, preferably 4 times or less, more preferably 3.5 times or less, even more preferably 3 times or less, and most preferably 1.5 times or less.

Even when exposed to plasma, the composite sintered body has a small increase in surface roughness compared to typical plasma-resistant materials, and even after the exposure to plasma, the composite sintered body has a relatively low surface roughness, so that contamination particles may be reduced since generated particles generated by etching may be easily discharged out of a chamber.

When the composite sintered body is exposed to $CF_4/O_2$ plasma of 500 W output and 100 W bias for 3 hours, the etching depth of the composite sintered body may be 200 nm or less, preferably 180 nm or less, and more preferably 150 nm or less.

The composite sintered body may have a crystal grain size of 100 nm to 1 μm, preferably 100 nm to 500 nm, and most preferably 150 nm to 350 nm.

Here, the crystal grain size of a composite sintered body means an average particle diameter of crystal grains.

The crystal grain size of the composite sintered body is very small compared to that of typical plasma resistance materials, and as a result, contaminant particles may be reduced since the size of generated particles generated by etching after the exposure to plasma becomes relatively small, allowing the generated particles to easily discharged out of a chamber.

The composite sintered body may have a biaxial strength of 100 MPa, preferably a biaxial strength of 200 MPa or greater, more preferably a biaxial strength of 300 MPa or greater, and most preferably a biaxial strength of 350 MPa or greater.

Before the above step, a step of molding the mixed yttria and the magnesia may be further included. The molding may be performed by cold isostatic pressing, but is not limited thereto.

In addition, before the above step, a step of performing pre-sintering may be further included. The above step may be performed at a temperature of 900° C. to 1200° C.

A plasma etching apparatus component for manufacturing a semiconductor manufactured by the method for manufacturing a plasma etching apparatus component for manufacturing a semiconductor provided in another aspect of the present invention may be formed of a bulk material of the composite sintered body.

In addition, the plasma etching apparatus component for manufacturing a semiconductor manufactured by the method for manufacturing a plasma etching apparatus component for manufacturing a semiconductor provided in another aspect of the present invention may be formed by coating the composite sintered body on another material. The another material may be, for example, a metal, a ceramic, a polymer, and the like, but is not limited to a specific material.

The plasma etching apparatus component for manufacturing a semiconductor manufactured by the method for manufacturing a plasma etching apparatus component for manufacturing a semiconductor provided in another aspect of the present invention may be nozzles, injectors, or rings, but is not limited thereto, and may be any component required to have plasma resistance in a plasma etching apparatus for manufacturing a semiconductor.

In yet another aspect of the present invention, there is provided a plasma etching apparatus for manufacturing a semiconductor including the plasma etching apparatus component.

MODE FOR CARRYING OUT THE INVENTION

Hereinafter, the present invention will be described in more in detail with reference to Examples, Comparative Examples, and Experimental Examples. The scope of the present invention is not limited to a particular embodiment and should be construed by the appended claims. In addition, it should be understood by those skilled in the art that many modifications and variations may be made without departing from the scope of the present invention.

Example 1

50 vol % of $Y_2O_3$ and 50 vol % of MgO were subjected to planetary milling under the condition of 300 rpm for 12 hours using a jar and ball made of YSZ, and then dried to prepare mixed powder.

The prepared mixed powder was subjected to cold isostatic pressing at 200 MPa for 5 minutes, and then pre-sintered in air at a temperature of 1000° C. for 1 hour. Thereafter, hot pressing was performed at 1200° C. and 30 MPa for 1 hour to obtain a composite sintered body. The relative density of the composite sintered body was measured at 98%.

Figure 2:
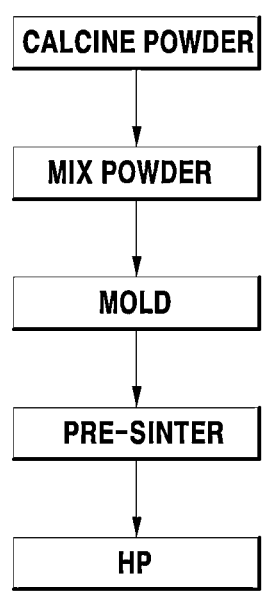
FIG. 2 is a schematic view of a method for manufacturing a composite sintered body according to one example of the present invention.

A schematic diagram of the above-described manufacturing process of a composite sintered body is shown in FIG. 2.

Example 2

A composite sintered body was manufactured in the same manner as in Example 1, except that hot pressing was performed at 1300° C. and 30 MPa for 1 hour to obtain a composite sintered body having a relative density of 100%.

Comparative Example 1

$Y_2O_3$ having a relative density of 98% was prepared.

Comparative Example 2

$Y_2O_3$ having a relative density of 100% was prepared.

Comparative Example 3

Spinel ($MgAl_2O_4$) having a relative density of 98% was prepared.

Comparative Example 4

Spinel ($MgAl_2O_4$) having a relative density of 100% was prepared.

<Experimental Example 1> Measurement of Weight Reduction Per Unit Area

A dry etcher was used as an inductively coupled plasma etcher (Manufacturer: DMS, Silicon/metal hybrid etcher). A plasma of 500 W and a bias of 100 W were applied to the ceramic of each of Examples 1 and 2 and Comparative Examples 1 to 4 under a vacuum condition of 5 mTorr with a gas of $CF_4$ 40 sccm+$O_2$ 10 sccm. For the ceramics, the weight reduction per unit area according to the plasma exposure time was measured.

The results are as shown in FIG. 1.

Example 1 has a relative density of 98%, but has an etching amount of 0.6 g/m² per hour, and thus, exhibits a significantly less etching amount with respect to plasma than the yttria of each of Comparative Example 1 and Comparative Example 2, and exhibits no significantly different etching amount when compared to the spinel of each of Comparative Example 3 and Comparative Example 4.

Example 2 with a relative density of 100% has an etching amount of 0.3 g/m² per hour, and thus, has a significantly reduced etching amount from the etching amount of the yttria of each of Comparative Example 1 and Comparative Example 2 as well as the etching amount of the spinel of each of Comparative Example 3 and Comparative Example 4.

That is, the composite sintered body of $Y_2O_3$—MgO exhibits significantly improved plasma corrosion resistance compared to yttria and spinel which are used as a typical plasma-resistant ceramic, and even when manufactured to have a relatively low relative density, exhibits plasma corrosion resistance equal to or significantly improved from that of a typical plasma-resistant ceramic.

<Experimental Example 2> Measurement of Etching Depth

The ceramic of each of Examples 1 and 2 and Comparative Examples 1 to 4 was exposed to plasma in the same manner as in Experimental Example 1, except that etching depth was measured unlike in Experimental Example 1.

Since the weight reduction as shown in Experimental Example 1 may be affected by the specific gravity of the ceramic, measuring the etching depth as shown in Experimental Example 2 may be more suitable for evaluating plasma corrosion resistance.

Figure 3:
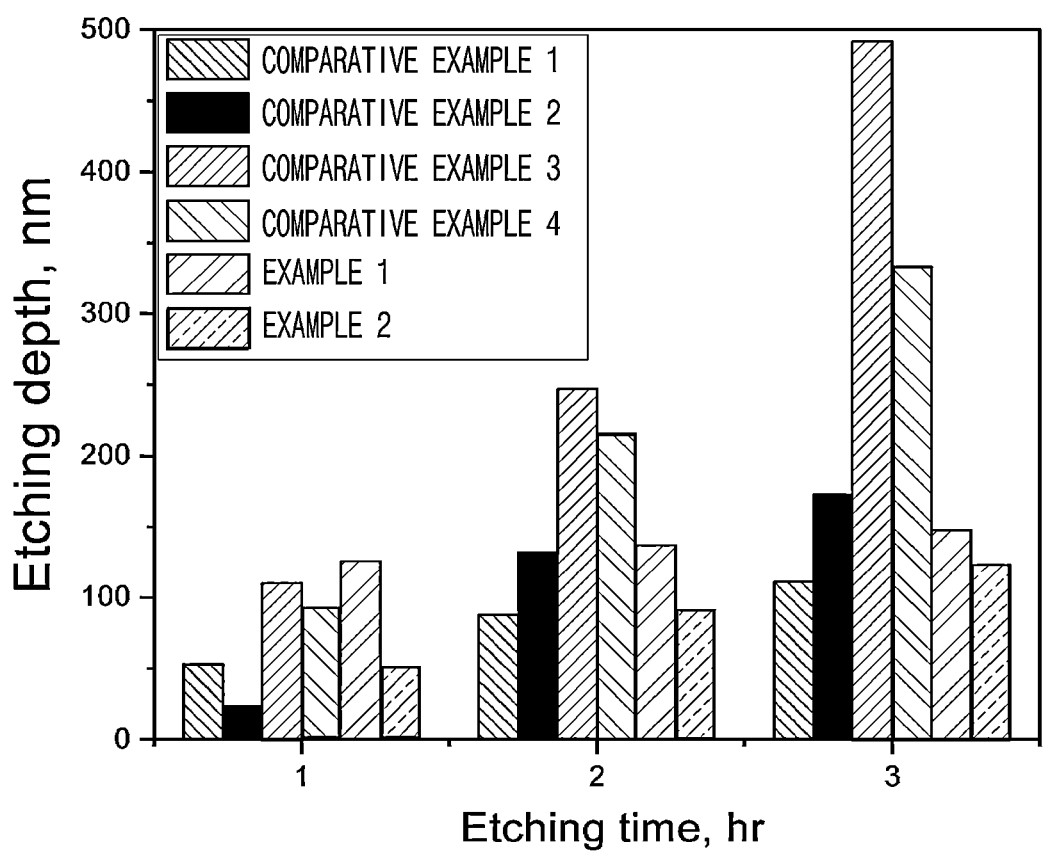
FIG. 3 is a graph showing the measurement of etching depth by etching using plasma according to one experimental example of the present invention.

The results are shown in FIG. 3.

Example 1 and Example 2 exhibited etching depths similar to those of Comparative Example 1 and Comparative Example 2.

However, the strengths of Example 1 and Example 2 are two times greater than or equal to those of Comparative Example 1 and Comparative Example 2, and the prices thereof are less than or equal to half the prices of Comparative Example 1 and Comparative Example 2, and thus, it is expected that the utilization of Example 1 and Example 2 will be much higher.

<Experimental Example 3> Comparison of Crystal Grain Sizes

Figure 4A:
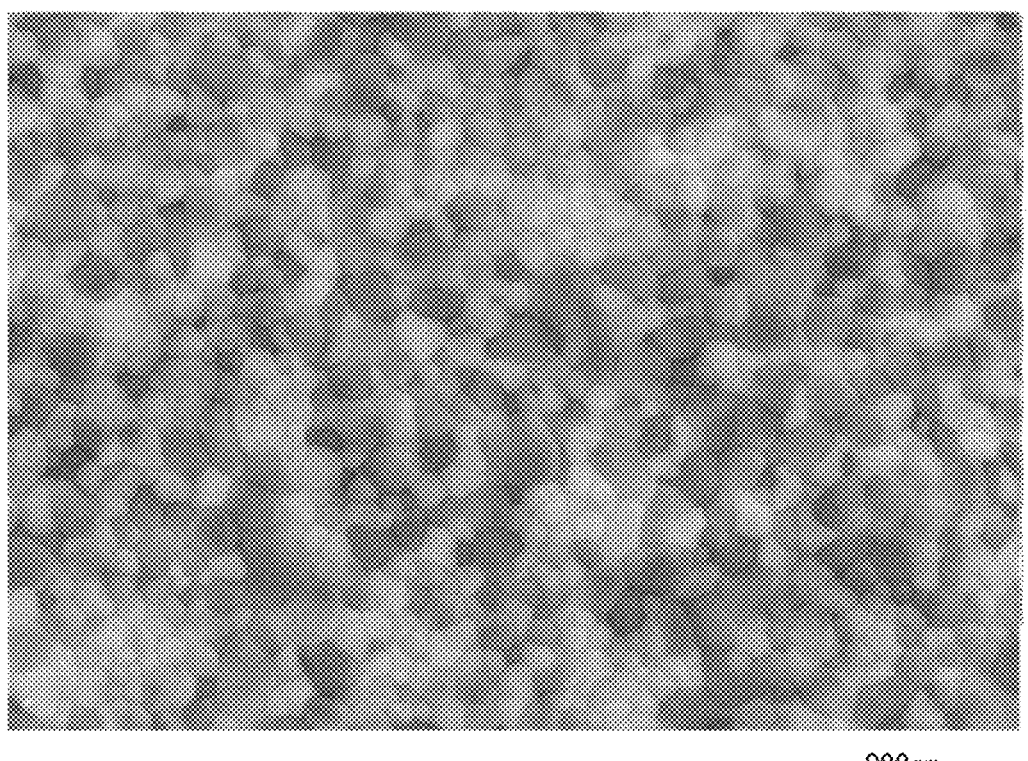
FIG. 4a to FIG. 4c are SEM images for examples and comparative examples of the present invention.
Figure 4B:
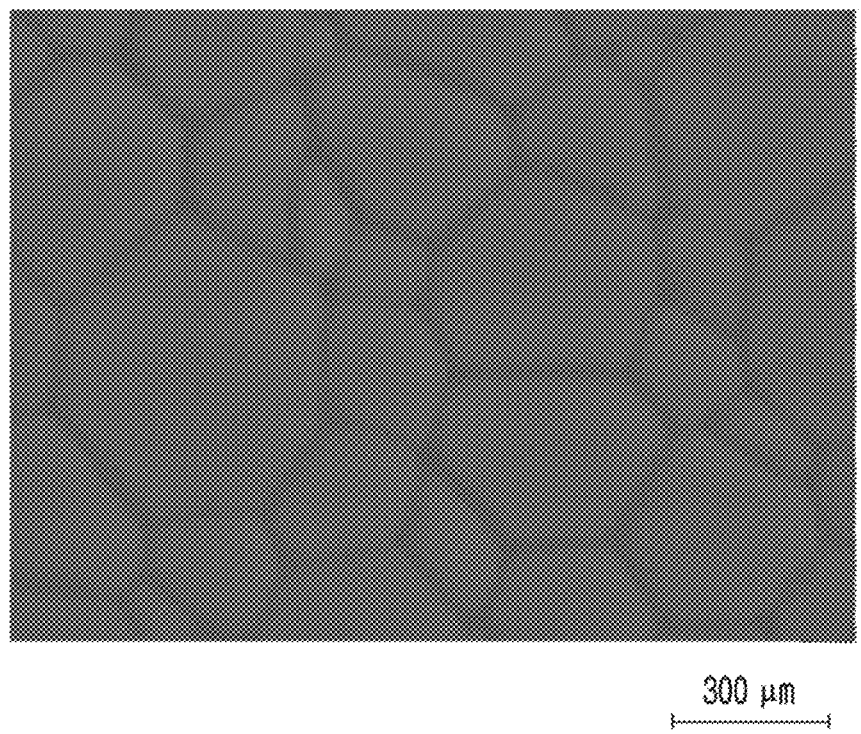
Figure 4C:
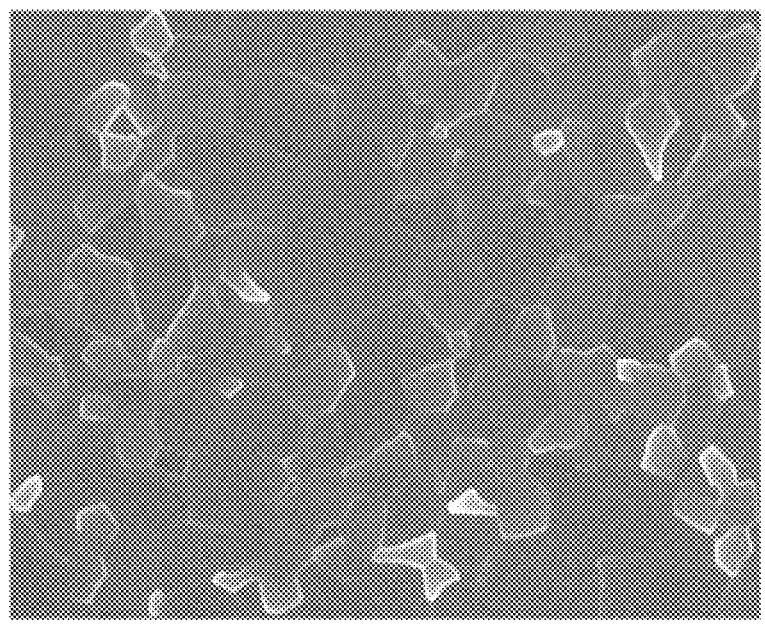
Figure 5A:
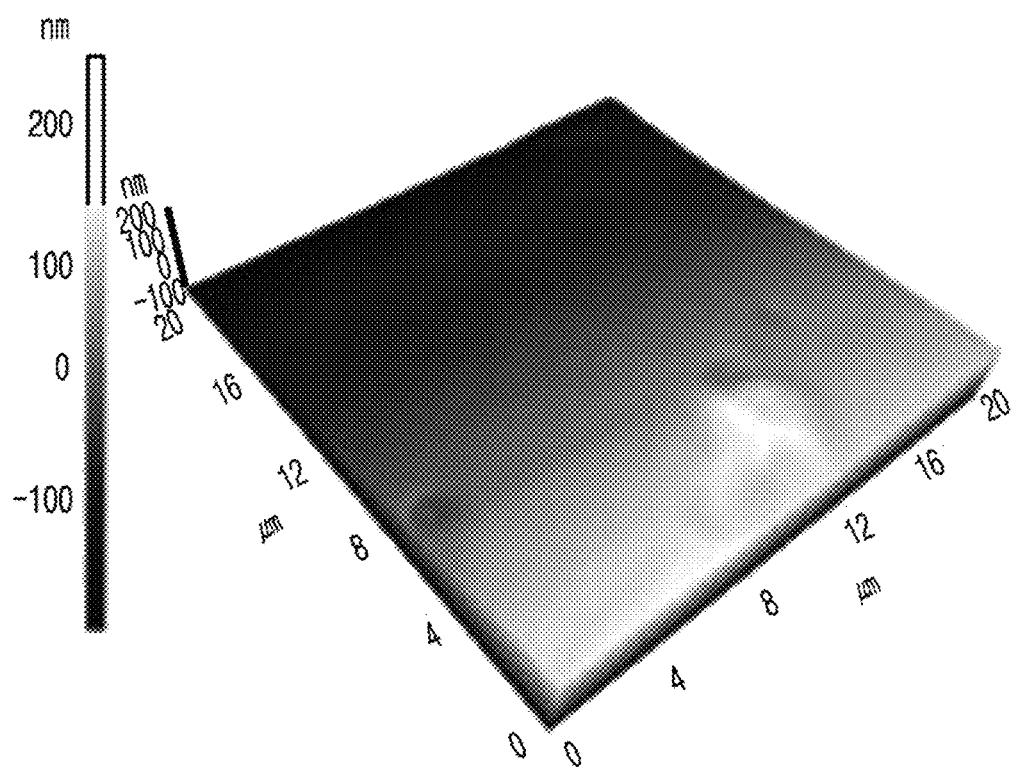
FIG. 5a to FIG. 5d are AFM images showing surface roughness after etching using plasma according to one experimental example of the present invention.
Figure 5B:
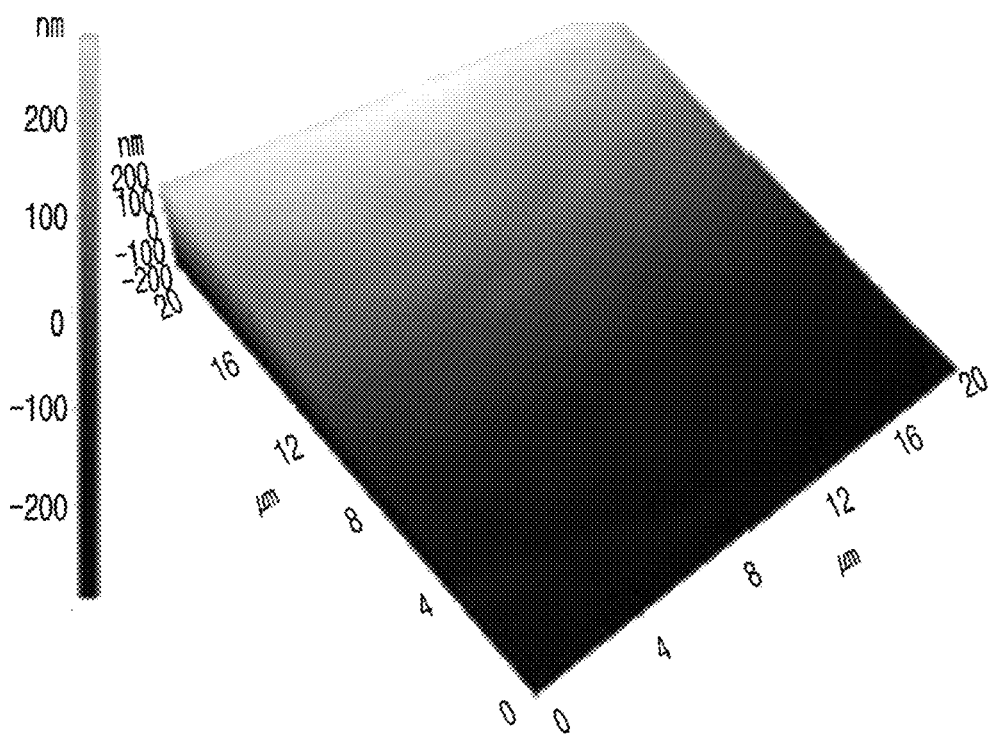
Figure 5C:
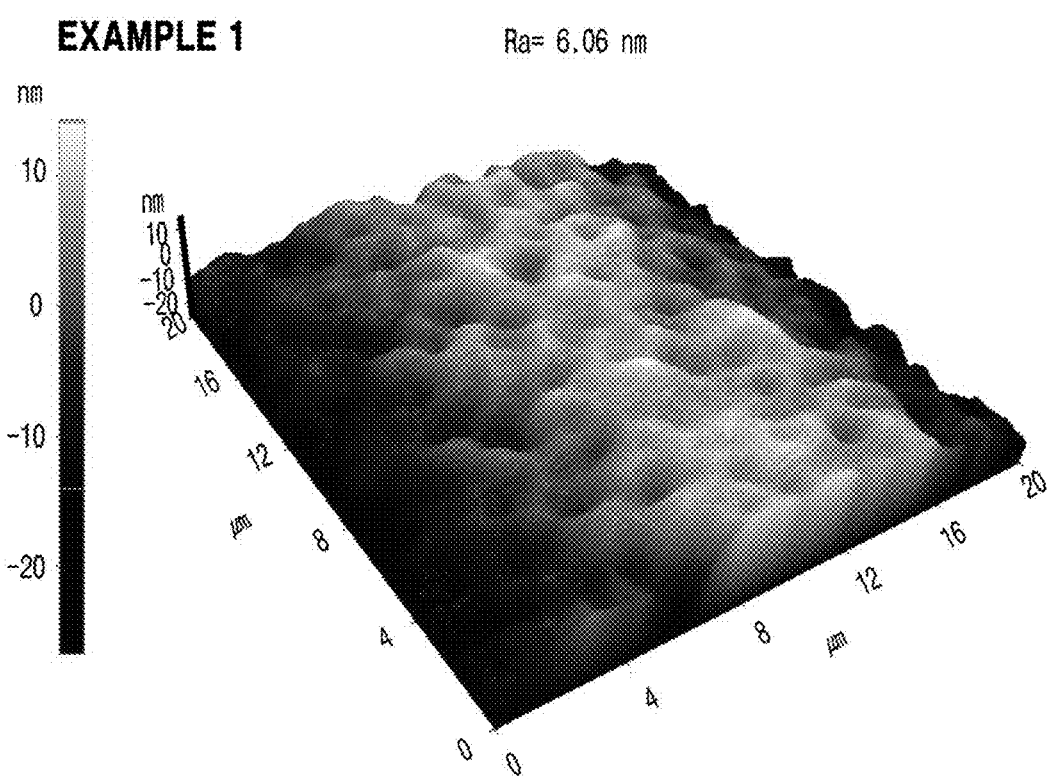
Figure 5D:
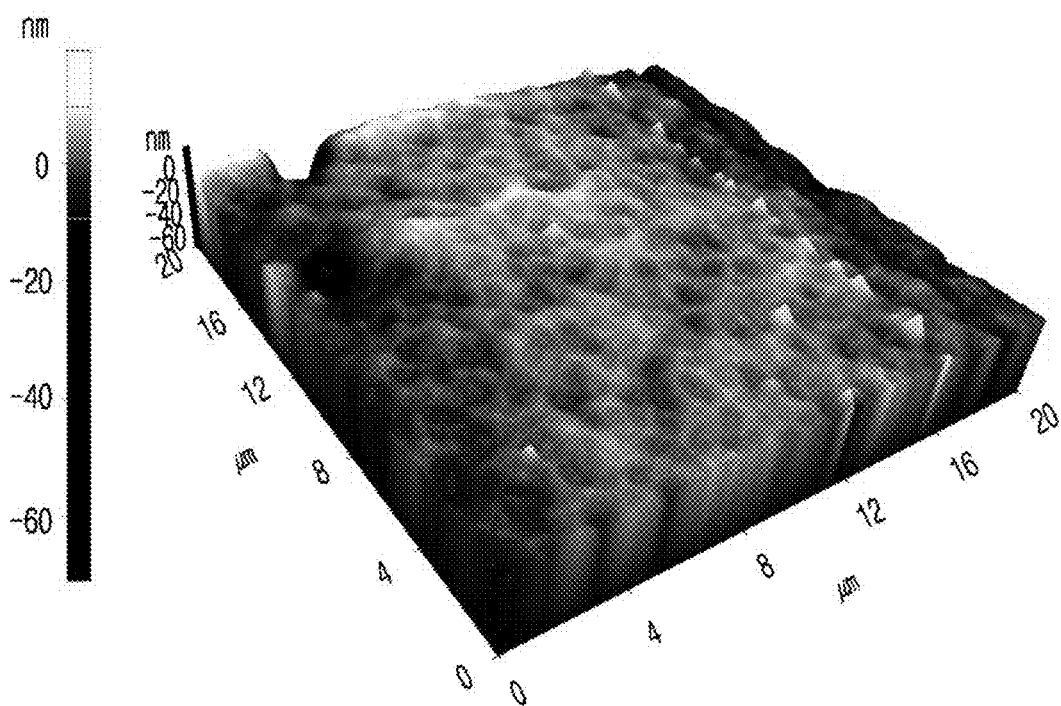

SEM images for Example 2, Comparative Example 2, and Comparative Example 4 are shown in FIG. 4a to FIG. 4c.

Referring to FIG. 4a to FIG. 4a, Example 2 has a crystal grain size of about 300 nm, whereas Comparative Example 2 and Comparative Example 4 have a crystal grain size of about several µm and more, so that it can be confirmed that the crystal grain size of Example 2 is much smaller.

It is possible to relatively easily sinter the ceramic of Example 2 to have a small crystal grain size, and when the crystal grain size is small as described above, the size of generated particles generated by plasma etching is reduced, and as a result, the generated particles are easily discharged out of a chamber by pumping out, so that it is possible to reduce the generation of contaminant particles.

<Experimental Example 4> Measurement of Surface Roughness

Example 1 and Example 2, and Comparative Example 2 and Comparative Example 4 were polished to have a surface roughness ($R_a$) of about 2 nm, and then the ceramics were exposed to a plasma of 500 W and a bias of 100 W under a vacuum condition of 5 mTorr with a gas of $CF_4$ 40 sccm+$O_2$ 10 sccm.

For the ceramics, the surface roughness ($R_a$) after the exposure to plasma was measured and shown in FIG. 5a to FIG. 5d.

Comparative Example 1 and Comparative Example 3 respectively have a surface roughness of about 9.0 nm and about 10.3 nm after the exposure to plasma, whereas Example 1 and Example 2 respectively have a surface roughness of about 2.28 nm and 6.05 nm, and thus, are confirmed to have a much lower surface roughness than Comparative Example 1 and Comparative Example 3.

When there is no big difference in surface roughness between before and after etching as in the case of Example 1 and Example 2, generated particles generated by plasma etching are easily discharged out of a chamber by pumping out, so that it is possible to reduce the generation of contaminant particles.

The invention claimed is:

1. A method of using a plasma etching apparatus in semiconductor manufacturing, the method comprising:
    using a plasma etching apparatus in semiconductor manufacturing, the plasma etching apparatus comprising a component including a composite sintered body therein,
    wherein the composite sintered body comprises 30 vol % to 70 vol % of yttria (Y2O3) and 30 vol % to 70 vol % of magnesia (MgO), and
    wherein the component has plasma resistance.

2. The method of claim 1 wherein the method further comprises forming plasma in the plasma etching apparatus.

3. The method of claim 1, wherein the component is at least one selected from a nozzle, an injector, and a ring.

4. The method of claim 1, wherein the composite sintered body has a crystal grain size of 100 nm to 1 µm.

5. The method of claim 1, wherein the composite sintered body has a crystal grain size of 100 nm to 500 nm.

6. The method of claim 1, wherein the composite sintered body has a relative density of 90% or higher.

7. The method of claim 1, wherein when the composite sintered body is exposed to CF4/O2 plasma of 500 W output and 100 W bias for 3 hours, the surface roughness (Ra) of the composite sintered body increases by 5 times or less.

8. The method of claim 1, wherein the composite sintered body has a surface roughness (Ra) of 2 nm or less.

9. The method of claim 1, wherein when the composite sintered body is exposed to CF4/O2 plasma of 500 W output and 100 W bias for 3 hours, the etching depth of the composite sintered body is 200 nm or less.

10. The method of claim 1, wherein the composite sintered body has a biaxial strength of 200 MPa or greater.

11. The method of claim 1, wherein the component is formed of a bulk material of the composite sintered body.

12. The method of claim 1, wherein the component is formed by coating the composite sintered body on another material.

13. A method of reducing etching by plasma in a plasma etching apparatus during semiconductor manufacturing, the method comprising:
- providing a plasma etching apparatus for manufacturing a semiconductor including a component including a composite sintered body,
- wherein the composite sintered body comprises 30 vol % to 70 vol % of yttria (Y2O3) and 30 vol % to 70 vol % of magnesia (MgO), and
- wherein the component has plasma resistance.

* * * * *